(12) United States Patent
Lin et al.

(10) Patent No.: US 10,734,146 B2
(45) Date of Patent: *Aug. 4, 2020

(54) STATE-OF-CHARGE INDICATION METHOD, DEVICE AND TERMINAL

(71) Applicant: GUANGDONG OPPO MOBILE TELECOMMUNICATIONS CORP., LTD., Dongguan, Guangdong (CN)

(72) Inventors: Yugui Lin, Guangdong (CN); Jiao Cheng, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/313,178

(22) PCT Filed: Jun. 8, 2017

(86) PCT No.: PCT/CN2017/087574
§ 371 (c)(1),
(2) Date: Dec. 26, 2018

(87) PCT Pub. No.: WO2018/006683
PCT Pub. Date: Jan. 11, 2018

(65) Prior Publication Data
US 2019/0156980 A1     May 23, 2019

(30) Foreign Application Priority Data
Jul. 8, 2016   (CN) .......................... 2016 1 0542802

(51) Int. Cl.
*H01F 7/06* (2006.01)
*G06F 11/30* (2006.01)
(Continued)

(52) U.S. Cl.
CPC ....... *H01F 7/064* (2013.01); *G01R 19/16542* (2013.01); *G01R 31/3646* (2019.01);
(Continued)

(58) Field of Classification Search
CPC ... G06F 1/1652; G06F 11/30; G01R 31/3648; G01R 31/3646; G01R 31/364;
(Continued)

(56) References Cited

U.S. PATENT DOCUMENTS 9,848,494 B2 * 12/2017 Huitema ................ H05K 1/183
2010/0220060 A1 * 9/2010 Kobayashi ................ G09F 9/33
345/168
(Continued)

FOREIGN PATENT DOCUMENTS

CN         1434537       8/2003
CN         103675690     3/2014
(Continued)

OTHER PUBLICATIONS

EPO, Office Action for EP Application No. 17823495.1, dated Jun. 14, 2019.
(Continued)

*Primary Examiner* — Huy Q Phan
*Assistant Examiner* — Dustin R Dickinson
(74) *Attorney, Agent, or Firm* — Hodgson Russ LLP

(57) ABSTRACT

The present disclosure discloses a state-of-charge indication method. The method includes: acquiring a current ratio of a remaining battery capacity to a total battery capacity; determining a target curvature angle of a flexible display screen associated with a terminal based at least on the current ratio; and controlling the flexible display screen to present the target curvature angle.

20 Claims, 6 Drawing Sheets

(51) Int. Cl.
*G01R 31/36* (2020.01)
*G01R 31/382* (2019.01)
*G01R 19/165* (2006.01)
*G06F 1/16* (2006.01)
*H01M 10/48* (2006.01)

(52) U.S. Cl.
CPC ....... *G01R 31/3648* (2013.01); *G01R 31/382* (2019.01); *G06F 1/1652* (2013.01); *G06F 11/30* (2013.01); *H01M 10/488* (2013.01)

(58) Field of Classification Search
CPC ................ G01R 31/382; G01R 31/371; G01R 19/16542; H02J 2007/0047; H02J 2007/005; H02M 10/488; H01F 7/064
See application file for complete search history.

(56) References Cited

U.S. PATENT DOCUMENTS

| | | | |
|---|---|---|---|
| 2014/0028547 | A1 | 1/2014 | Bromley et al. |
| 2014/0118271 | A1* | 5/2014 | Lee ....................... G06F 3/0485 |
| | | | 345/173 |
| 2015/0155730 | A1* | 6/2015 | Miller ................... H02J 7/0054 |
| | | | 320/114 |
| 2016/0041597 | A1* | 2/2016 | Graham ................ G06F 1/3212 |
| | | | 713/323 |
| 2016/0183364 | A1 | 6/2016 | Choi et al. |
| 2017/0181304 | A1* | 6/2017 | Lee ........................ H05K 7/005 |

FOREIGN PATENT DOCUMENTS

| | | |
|---|---|---|
| CN | 105071486 | 11/2015 |
| CN | 105138187 | 12/2015 |
| CN | 106227634 | 12/2016 |
| EP | 2778845 | 9/2014 |
| EP | 2796983 | 10/2014 |
| WO | 2009026909 | 3/2009 |

OTHER PUBLICATIONS

SIPO, First Office Action for CN Application No. 201610542802, dated Jul. 27, 2017.
WIPO, ISR for PCT/CN2017/087574, Sep. 5, 2017.

* cited by examiner

400

US 10,734,146 B2

STATE-OF-CHARGE INDICATION METHOD, DEVICE AND TERMINAL

CROSS-REFERENCE TO RELATED APPLICATION

The present application is a national phase of International Application No. PCT/CN2017/087574, filed on Jun. 8, 2017, which is based upon and claims priority to Chinese Patent Application No. 201610542802.4, filed on Jul. 8, 2016, the entirety contents of which are incorporated herein by reference.

FIELD

The present disclosure relates to electronic technologies, and more particularly to a state-of-charge indication method, a state-of-charge indication device and a terminal.

BACKGROUND

When a terminal, such as a smartphone, a tablet computer or the like, is charged, a screen is turned off generally, such that the user needs to turn on the screen when the user would like to know a charging progress of the terminal. In practice, assuming that the terminal which is charged is far away from the user, the user needs to move to the place where the terminal is located. Further, assuming that the user checks the charging progress frequently, the user needs to turn on the screen repeatedly. In other words, tedious operations are required for implementing the method for acquiring the charging progress of the terminal in the related art, thus leading to inconvenience and a poor intuition.

DISCLOSURE

Embodiments of the present disclosure provide a state-of-charge indication method, a state-of-charge charging indication device and a terminal.

Embodiments of the present disclosure provide a state-of-charge indication method. The method includes: acquiring a current ratio of a remaining battery capacity to a total battery capacity; determining a target curvature angle of a flexible display screen associated with a terminal based at least on the current ratio; and controlling the flexible display screen to present the target curvature angle.

Embodiments of the present disclosure provide a state-of-charge indication device. The device includes a non-transitory computer-readable medium comprising computer-executable instructions stored thereon, and an instruction execution system which is configured by the instructions to implement at least one of a battery capacity detecting module, an angle determining module and a curvature controlling module. The battery capacity detecting module is configured to acquire a current ratio of a remaining battery capacity to a total battery capacity. The angle determining module is configured to determine a target curvature angle of a flexible display screen associated with a terminal based at least on the current ratio. The curvature controlling module is configured to control the flexible display screen to present the target curvature angle.

Embodiments of the present disclosure provide a terminal. The terminal includes a flexible display screen, a battery, a plurality of electromagnets, memory and a processor. A set of programs is stored in the memory. The processor is configured to call the programs stored in the memory to perform followings: acquiring a current ratio of a remaining battery capacity to a total battery capacity; determining a target curvature angle of the flexible display screen based at least on the current ratio; and controlling the flexible display screen to present the target curvature angle.

BRIEF DESCRIPTION OF THE DRAWINGS

To illustrate the solutions according to the embodiments of the present disclosure more clearly, accompanying drawings needed for describing the embodiments are briefly introduced below. Obviously, the accompanying drawings in the following descriptions are merely some embodiments of the present disclosure, and persons of ordinary skill in the art may obtain other drawings according to the accompanying drawings without making creative efforts.

EMBODIMENTS OF THE PRESENT DISCLOSURE

The solutions of the embodiments of the present disclosure are clearly and completely described below with reference to the accompanying drawings in the embodiments of the present disclosure. Obviously, the described embodiments are merely part of rather than all of the embodiments of the present disclosure. All other embodiments obtained by persons of ordinary skill in the art based on the embodiments of the present disclosure without making creative efforts shall fall within the protection scope of the present disclosure.

A charging indication method provided by embodiments of the present disclosure is applied in a terminal. The terminal includes a smartphone, a tablet computer, a smart wearable device, a digital audio and video player, an electronic reader, a hand-held game console, a vehicle-mounted electronic device or other electronic devices.

Figure 1:
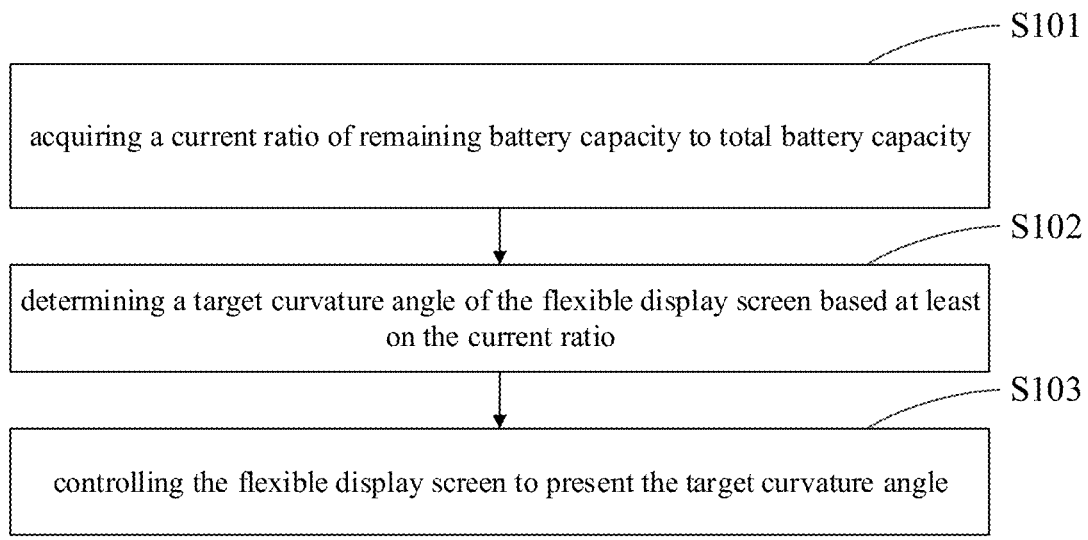
FIG. 1 is a flow chart of a charging indication method according to an embodiment of the present disclosure.

FIG. 1 is a flow chart of a charging indication method according to an embodiment of the present disclosure. The method is applied in a terminal including a flexible display screen and a battery. As illustrated in FIG. 1, the method includes followings.

At block S101, in response to detecting that the terminal is in a charging state, a current ratio of remaining battery capacity to total battery capacity is acquired.

In detail, the terminal detects whether the terminal is in the charging state. When the terminal is in the charging state, the current ratio of the remaining battery capacity to the total battery capacity is acquired. When the terminal is not in the charging state, no further processing is required. For example, assuming that the remaining battery capacity is 2000 mAh and the total battery capacity is 2500 mAh, the current ratio is 80% (=2000/2500).

In an implementation, the terminal may detect whether the battery is in the charging state through a power management system, or may detect the remaining battery capacity through the power management system to calculate the current ratio of the remaining battery capacity to the total battery capacity.

Figure 5:
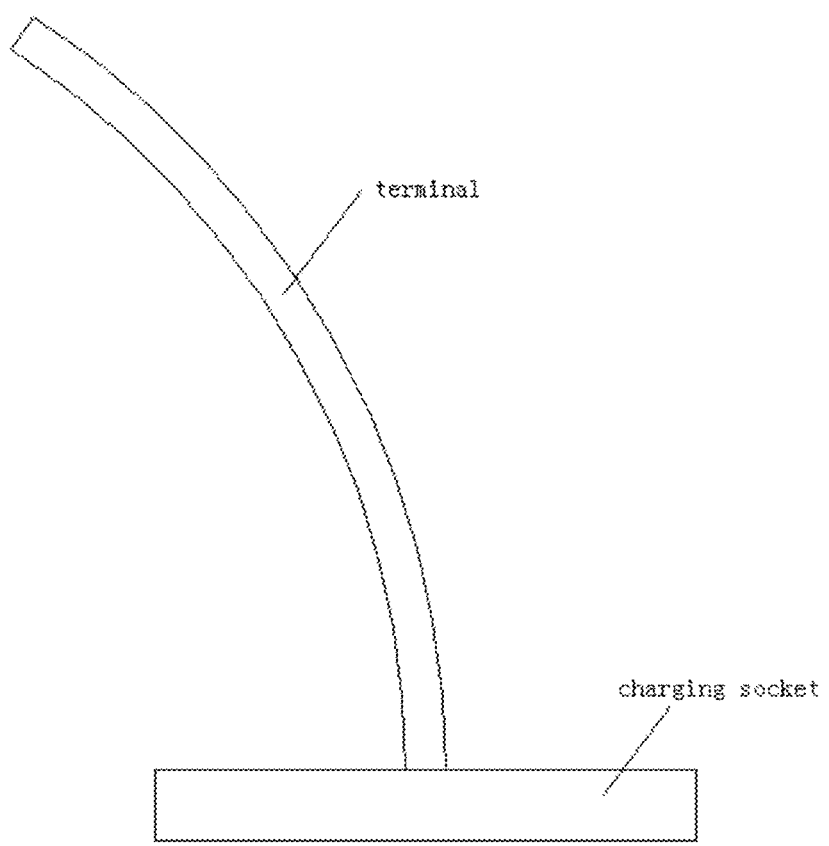
FIG. 5 is a schematic diagram of a charging state according to an embodiment of the present disclosure.

In an embodiment, the terminal may be charged by coupling to a power wire, or by coupling to a charging socket, which is not limited herein. Preferably, the terminal is charged by coupling to the charging socket, and the jack of the charging socket go upwards such that the terminal may be located vertically, as illustrated in FIG. 5, which is convenient for the user to check a shape change.

At block S102, a target curvature angle of the flexible display screen is determined based at least on the current ratio.

Alternately, before block S102, the terminal determines whether the current ratio is greater than a predetermined ratio threshold, if yes, an act at block S103 is executed, otherwise, an act at block S101 is executed. The predetermined ratio threshold may be configured by a manufacturer of the terminal before the terminal comes onto the market, or may be configured by the user in advance, which is not limited herein. For example, the predetermined ratio threshold can be set to be 2%. In some embodiments, the purpose of determining whether the current ratio is greater than the predetermined ratio threshold is in that, a power consumption is caused by a curvature of the terminal, when the remaining battery capacity is low, the curvature of the terminal may cause the battery to discharge overly or cause the terminal to be shut down.

Figure 7:
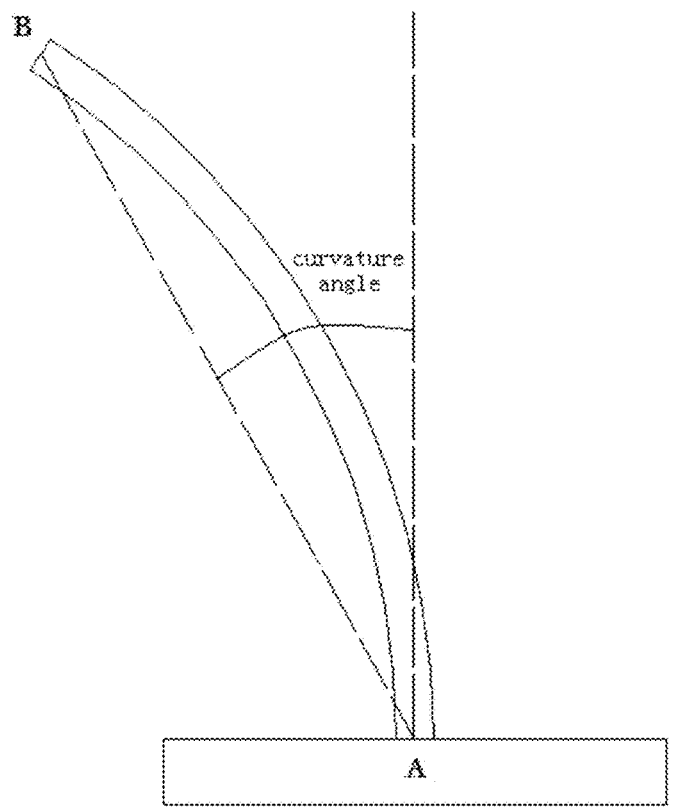
FIG. 7 is a schematic diagram of a curvature angle according to another embodiment of the present disclosure.

In detail, the terminal determines the target curvature angle of the flexible display screen based at least on the current ratio. When the curvature of the flexible display screen occurs, the curvature angle of the flexible display screen can be calculated in many ways. The curvature angle of the flexible display screen may be an angle between a tangent plane at the maximum curvature of the flexible display screen and a predetermined reference plane (the predetermined reference plane may be a horizontal plane or a reference plane perpendicular to the horizontal plane). When the terminal is charged via the charging socket, the curvature angle of the flexible display screen may be an angle between a line connecting two ends of the terminal and a line perpendicular to a surface of the charging socket, or may be an angle between the line connecting two ends of the terminal and a line parallel to the surface of the charging socket. The curvature angle of the flexible display screen may be an angle between the line connecting two ends of the terminal and a predetermined reference plane or a predetermined reference line (the predetermined reference line may be a line in a tangent plane of one end of the terminal). For example, the curvature angle may be an angle between a line connecting two ends of the terminal and a tangent line at one end, as illustrated in FIG. 7, the curvature angle is the angle between a line connecting points A and B and a tangent line at point A. The bigger the curvature angle is, the higher the curvature of the terminal is.

Alternatively, the terminal stores a pre-established correspondence between ratios and curvature angles, such that the terminal may query the target curvature angle corresponding to the current ratio according to the correspondence. For example, assuming that the current ratio is 10% and the curvature angle corresponding to the ratio of 10% in the correspondence is 30°, the terminal may query the target curvature angle of 30°.

Figure 6:
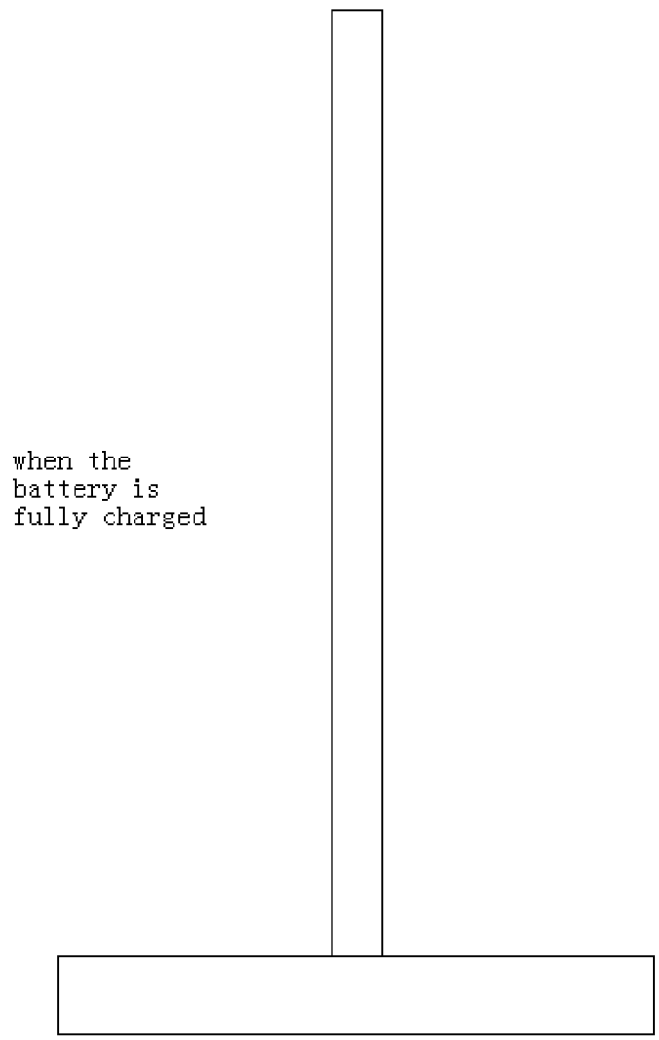
FIG. 6 is a schematic diagram of a charging state according to another embodiment of the present disclosure.

In an embodiment, the ratio may be in inverse proportion to or in proportion to the curvature angle in the correspondence, which is not limited herein. Preferably, the ratio is in inverse proportion to the curvature angle in the correspondence, such that the higher the ratio is, the smaller the curvature angle is. Further, in the correspondence, the curvature angle of 0° has a corresponding ratio of 1. The curvature angle of 0° means that there is no curvature. When the battery is fully charged, the terminal is straight, as illustrated in FIG. 6.

At block S103, the flexible display screen is controlled to present the target curvature angle, so as to indicate a charging progress through the target curvature angle.

For example, during a process of the current ratio changing from 0% to 100%, the curvature angle of the flexible display screen changes from 45° to 0°. In other words, the terminal becomes straight from a bent state. The user may acquire the charging progress from the curvature angle of the terminal.

Figure 8:
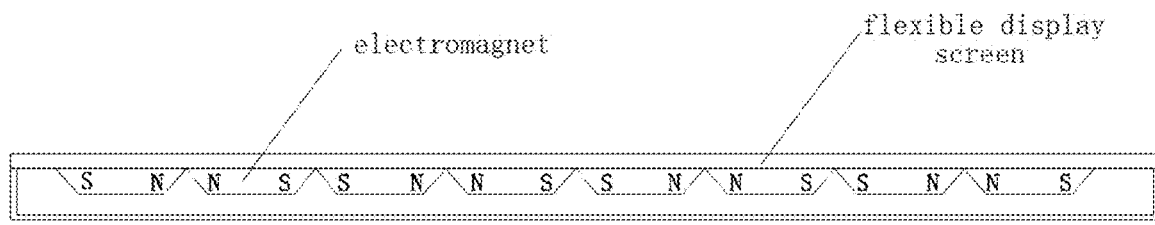
FIG. 8 is a schematic diagram of a state of a plurality of electromagnets according to an embodiment of the present disclosure.
Figure 9:
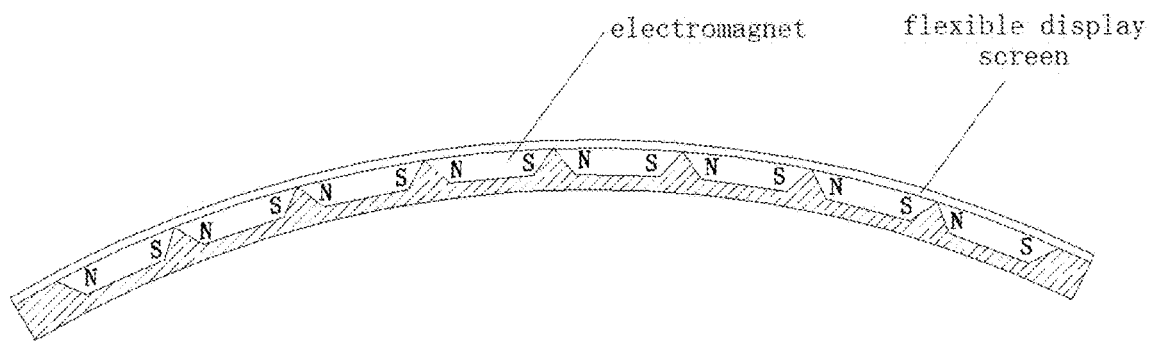
FIG. 9 is a schematic diagram of another state of a plurality of electromagnets according to an embodiment of the present disclosure.

Alternatively, the flexible display screen of the terminal may be provided a plurality of electromagnets arranged side by side at the backside, as illustrated in FIG. 8. The electromagnet may be in a form of prismatic table. The terminal may control a polarity of an electrode and a magnetic intensity of each electromagnet, so as to control the attractive force and/or repulsive force between the electromagnets. Accordingly, the terminal may control the flexible display screen to present the target curvature angle by controlling the polarities of electrodes and/or magnetic intensities of the plurality of electromagnets. For example, when the south magnetic pole and the north magnetic pole present alternately in the plurality of electromagnets, as illustrated in FIG. 9, the attractive force between the electromagnets can be controlled by controlling the magnetic intensity of each electromagnet, such that the degree of curl of each electromagnet can be controlled, further the curvature degree of the terminal can be controlled.

The terminal including the flexible display screen and the battery according to the embodiments of the present disclosure may acquire the current ratio of the remaining battery capacity to the total battery capacity in response to detecting that the terminal is in the charging state, determines the target curvature angle of the flexible display screen based at least on the current ratio and controls the flexible display screen to present the target curvature angle so as to indicate the charging progress through the target curvature angle. In this way, the user may acquire the charging progress conveniently and intuitively.

Figure 2:
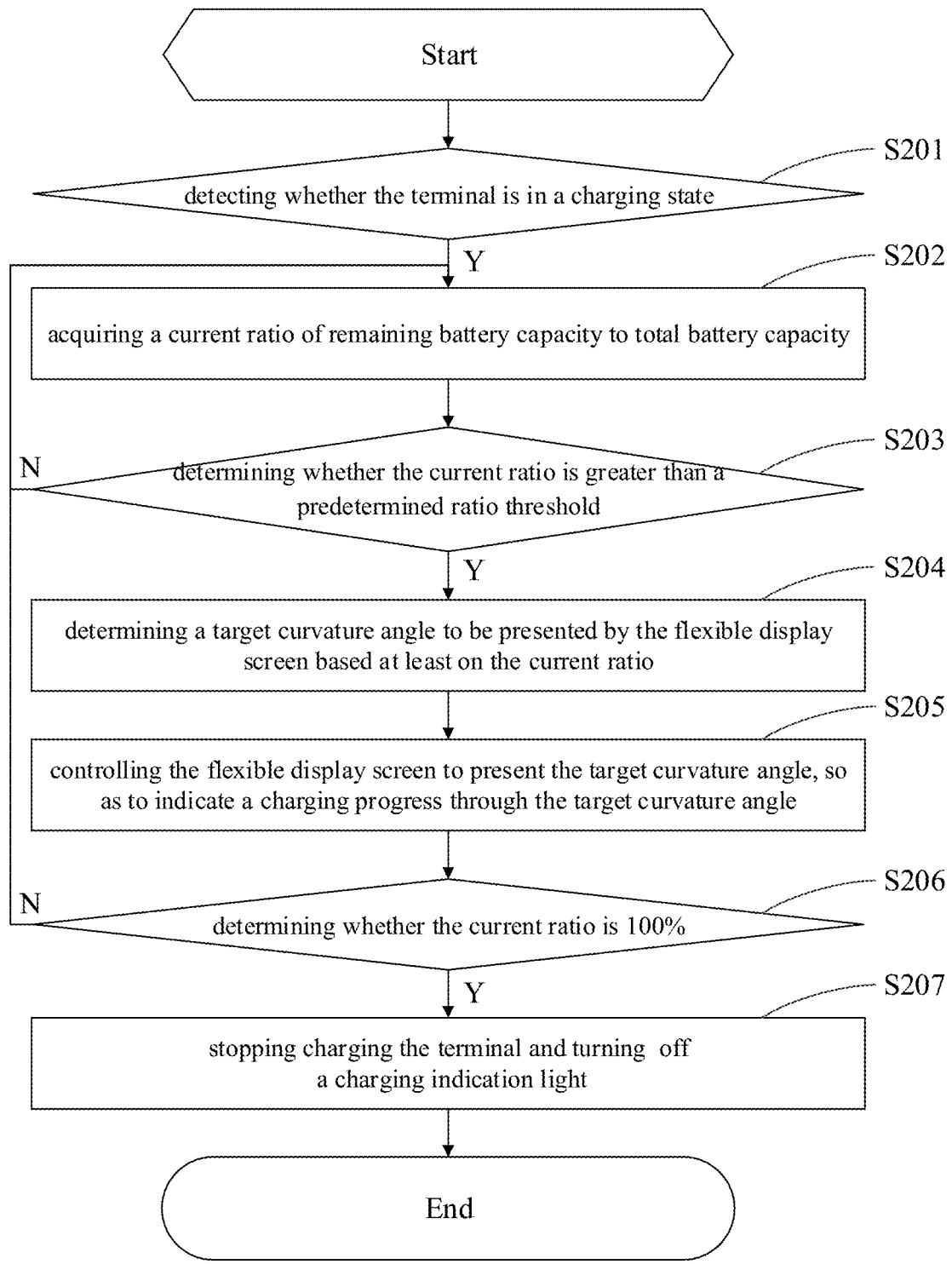
FIG. 2 is a flow chart of a charging indication method according to another embodiment of the present disclosure.

FIG. 2 is a flow chart of a charging indication method according to another embodiment of the present disclosure. The method is applied in a terminal including a flexible display screen and a battery. As illustrated in FIG. 2, the method includes followings.

At block S201, it is detected whether the terminal is in a charging state.

In detail, the terminal detects whether the terminal is in the charging state, if yes, an act at block S202 is executed, otherwise, no further processing is required.

In an embodiment, the terminal may be charged by coupling to a power wire, or by coupling to a charging socket, which is not limited herein. Preferably, the terminal is charged by coupling to the charging socket, and the jack of the charging socket go upwards such that the terminal may be located vertically, as illustrated in FIG. 5, which is convenient for the user to check a shape change.

At block S202, a current ratio of remaining battery capacity to total battery capacity is acquired.

In detail, the terminal detects the remaining battery capacity through a power management system to calculate the current ratio of the remaining battery capacity to the total battery capacity. For example, assuming that the remaining battery capacity is 2000 mAh and the total battery capacity is 2500 mAh, the current ratio is 80% (=2000/2500). In an implementation, the terminal may detect whether the battery is in the charging state through the power management system.

At block S203, it is determined whether the current ratio is greater than a predetermined ratio threshold.

In detail, the terminal determines whether the current ratio is greater than the predetermined ratio threshold, if yes, an act at block S204 is executed, otherwise, an act at block S202 is executed. The predetermined ratio threshold may be configured by a manufacturer of the terminal before the terminal comes onto the market, or may be configured by the user in advance, which is not limited herein. For example, the predetermined ratio threshold can be set to be 2%.

In some embodiments, the purpose of determining whether the current ratio is greater than the predetermined ratio threshold is in that, a power consumption is caused by a curvature of the terminal, when the remaining battery capacity is low, the curvature of the terminal may cause the battery to discharge overly or cause the terminal to be shut down.

At block S204, a target curvature angle of the flexible display screen is determined based at least on the current ratio.

In detail, the terminal determines the target curvature angle of the flexible display screen based at least on the current ratio. The curvature angle may be an angle between a line connecting two ends of the terminal and a tangent line at one end, as illustrated in FIG. 7, the curvature angle is the angle between a line connecting points A and B and a tangent line at point A. The bigger the curvature angle is, the higher the curvature of the terminal is.

Alternatively, the terminal stores a pre-established correspondence between ratios and curvature angles, such that the terminal may query the target curvature angle corresponding to the current ratio according to the correspondence. For example, assuming that the current ratio is 10% and the curvature angle corresponding to the ratio of 10% in the correspondence is 30°, the terminal may query the target curvature angle of 30°.

In an embodiment, the ratio may be in inverse proportion to or in proportion to the curvature angle in the correspondence, which is not limited herein. Preferably, the ratio is in inverse proportion to the curvature angle in the correspondence, such that the higher the ratio is, the smaller the curvature angle is. Further, in the correspondence, the curvature angle of 0° has a corresponding ratio of 1. The curvature angle of 0° means that there is no curvature. When the battery is fully charged, the terminal is straight, as illustrated in FIG. 6.

At block S205, the flexible display screen is controlled to present the target curvature angle, so as to indicate a charging progress through the target curvature angle.

For example, during a process of the current ratio changing from 0% to 100%, the curvature angle of the flexible display screen changes from 45° to 0°. In other words, the terminal becomes straight from a bent state. The user may acquire the charging progress from the curvature angle of the terminal.

Alternatively, the flexible display screen of the terminal may be provided a plurality of electromagnets arranged side by side at the backside, as illustrated in FIG. 8. The electromagnet may be in a form of prismatic table. The terminal may control a polarity of an electrode and a magnetic intensity of each electromagnet, so as to control the attractive force and/or repulsive force between the electromagnets. Accordingly, the terminal may control the flexible display screen to present the target curvature angle by controlling the polarities of electrodes and/or magnetic intensities of the plurality of electromagnets. For example, when the south magnetic pole and the north magnetic pole present alternately in the plurality of electromagnets, as illustrated in FIG. 9, the attractive force between the electromagnets can be controlled by controlling the magnetic intensity of each electromagnet, such that the degree of curl of each electromagnet can be controlled, further the curvature degree of the terminal can be controlled.

At block S206, it is determined whether the current ratio is 100%.

In detail, the terminal determines whether the current ratio is 100%, if yes, an act at block S207 is executed, otherwise, an act at block S202 is executed.

At block S207, the terminal is not charged and a charging indication light is turned off.

In an embodiment, the charging of the terminal is stopped, such that overcharging of the terminal can be avoided. Additionally, in the related art, during the charging process of the terminal, when the charging indication light illuminates red light or yellow light, it indicates that the terminal is charged. When the charging indication light illuminates green light, it indicates that the charging is completed. However, in the present disclosure, the user may determine whether the charging is completed according to the shape change of the terminal, for example, when the terminal is straight, it indicates that the charging is completed, such that it is unnecessary to utilize the charging indication light to indicate whether the charging is completed, and the power consumption caused by the charging indication light can be avoided by turning off the charging indication light.

The terminal including the flexible display screen and the battery according to the embodiments of the present disclosure may acquire the current ratio of the remaining battery capacity to the total battery capacity in response to detecting that the terminal is in the charging state, determines the target curvature angle of the flexible display screen based at least on the current ratio and controls the flexible display screen to present the target curvature angle so as to indicate the charging progress through the target curvature angle. In this way, the user may acquire the charging progress conveniently and intuitively.

Figure 3:
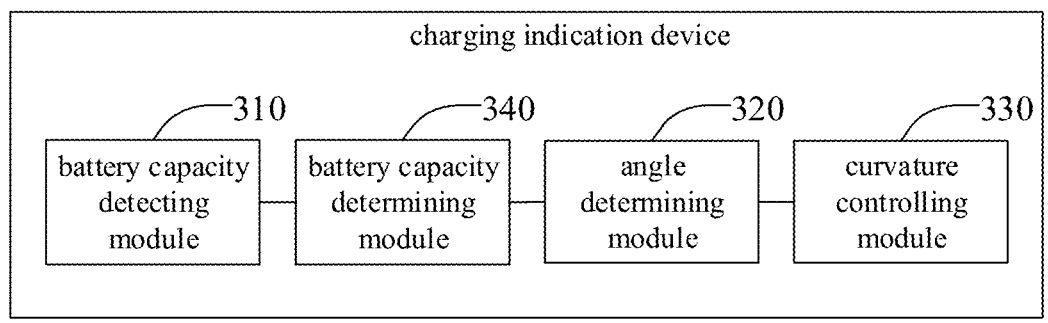
FIG. 3 is a block diagram of a charging indication device according to an embodiment of the present disclosure.

FIG. 3 is a block diagram of a charging indication device according to an embodiment of the present disclosure. As illustrated in FIG. 3, the device at least includes a battery capacity detecting module 310, an angle determining module 320 and a curvature controlling module 330.

The battery capacity detecting module 310 is configured to, in response to detecting that terminal is in a charging state, acquire a current ratio of remaining battery capacity to total battery capacity.

In detail, the battery capacity detecting module 310 detects whether the terminal is in the charging state. When the terminal is in the charging state, the current ratio of the remaining battery capacity to the total battery capacity is acquired. When the terminal is not in the charging state, no further processing is required. For example, assuming that the remaining battery capacity is 2000 mAh and the total battery capacity is 2500 mAh, the current ratio is 80% (=2000/2500).

In an implementation, the battery capacity detecting module 310 may detect whether the battery is in the charging state through a power management system, or may detect the remaining battery capacity through the power management system to calculate the current ratio of the remaining battery capacity to the total battery capacity.

In an embodiment, the terminal may be charged by coupling to a power wire, or by coupling to a charging socket, which is not limited herein. Preferably, the terminal is charged by coupling to the charging socket, and the jack of the charging socket go upwards such that the terminal may be located vertically, as illustrated in FIG. 5, which is convenient for the user to check a shape change.

The angle determining module 320 is configured to determine a target curvature angle of the flexible display screen based at least on the current ratio.

In detail, the angle determining module 320 determines the target curvature angle of the flexible display screen based at least on the current ratio. The curvature angle may be an angle between a line connecting two ends of the terminal and a tangent line at one end, as illustrated in FIG. 7, the curvature angle is the angle between a line connecting points A and B and a tangent line at point A. The bigger the curvature angle is, the higher the curvature of the terminal is.

Alternatively, the terminal stores a pre-established correspondence between ratios and curvature angles, such that the angle determining module 320 may query the target curvature angle corresponding to the current ratio according to the correspondence. For example, assuming that the current ratio is 10% and the curvature angle corresponding to the ratio of 10% in the correspondence is 30°, the angle determining module 320 may query the target curvature angle of 30°.

In an embodiment, the ratio may be in inverse proportion to or in proportion to the curvature angle in the correspondence, which is not limited herein. Preferably, the ratio is in inverse proportion to the curvature angle in the correspondence, such that the higher the ratio is, the smaller the curvature angle is. Further, in the correspondence, the curvature angle of 0° has a corresponding ratio of 1. The curvature angle of 0° means that there is no curvature. When the battery is fully charged, the terminal is straight, as illustrated in FIG. 6.

The curvature controlling module 330 is configured to control the flexible display screen to present the target curvature angle, so as to indicate a charging progress through the target curvature angle.

For example, during a process of the current ratio changing from 0% to 100%, the curvature angle of the flexible display screen changes from 45° to 0°. In other words, the terminal becomes straight from a bent state. The user may acquire the charging progress from the curvature angle of the terminal.

Alternatively, the flexible display screen of the terminal may be provided a plurality of electromagnets arranged side by side at the backside, as illustrated in FIG. 8. The electromagnet may be in a form of prismatic table. The curvature controlling module 330 may control a polarity of an electrode and a magnetic intensity of each electromagnet, so as to control the attractive force and/or repulsive force between the electromagnets. Accordingly, the curvature controlling module 330 may control the flexible display screen to present the target curvature angle by controlling the polarities of electrodes and/or magnetic intensities of the plurality of electromagnets. For example, when the south magnetic pole and the north magnetic pole present alternately in the plurality of electromagnets, as illustrated in FIG. 9, the attractive force between the electromagnets can be controlled by controlling the magnetic intensity of each electromagnet, such that the degree of curl of each electromagnet can be controlled, further the curvature degree of the terminal can be controlled.

As illustrated in FIG. 3, the device may further include a battery capacity determining module 340 configured to determine whether the current ratio is greater than a predetermined ratio threshold.

Accordingly, the angle determining module 320 is configured to determine the target curvature angle of the flexible display screen when the current ratio is greater than the predetermined ratio threshold. The battery capacity detecting module 310 is further configured to acquire a new ratio of the remaining battery capacity to the total battery capacity when the current ratio is not greater than the predetermined ratio threshold.

Figure 4:
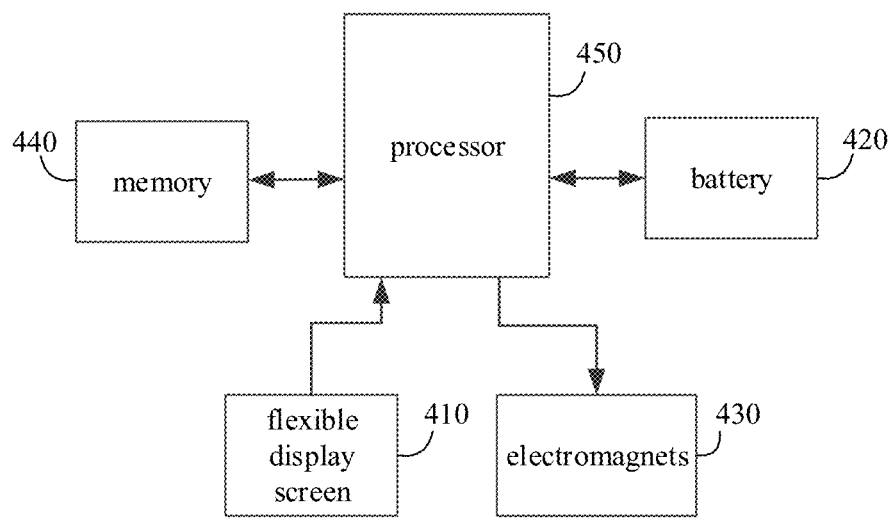
FIG. 4 is a block diagram of a terminal according to an embodiment of the present disclosure.

FIG. 4 is a block diagram of a terminal according to an embodiment of the present disclosure. The terminal may implement the charging indication method provided by the embodiments of the present disclosure with reference to FIG. 1-FIG. 2.

The terminal 400 may include a flexible display screen 410, a battery 420, a plurality of electromagnets 430, memory 440 having one or more computer-readable storage mediums, a processor 450, and other components. A structure of the terminal illustrated in FIG. 4 shall not be construed to limit the terminal. The terminal may include more or less components than those illustrated, or some components may be combined, or the components may be arranged differently.

The flexible display screen 410 may be configured to display information inputted by a user or information provided to the user, and various graphic user interfaces of applications for calling devices. The graphic user interfaces may be constituted by patterns, text, icons, videos or any combination thereof. The flexible display screen 410 may be bent or curved.

The battery 420 is configured to supply power to the components. Preferably, the battery 420 may be coupled to the processor 450 logically via a power management system, such that the charging, discharging, battery capacity detection and other functions can be managed through the power management system. The battery 420 may include one or more direct-current or alternating-current power supply, a rechargeable system, a power fault detection circuit, a power converter or inverter, a power state indicator and other elements.

The electromagnet 430 may be coupled to the processor 450 logically via a drive management circuit, such that functions such as plurality adjustment and magnetism adjustment of the electromagnet 430 can be implemented through the drive management circuit.

The memory 440 may be configured to store software programs or modules. The processor 450 is configured to execute various functional applications and data processes by running the software programs and modules stored in the memory 440. The memory 440 may mainly include a program storage region and a data storage region. In addition, the memory 440 may include a high speed random access memory and may include a non-volatility memory, such as at least one disk memory, a flash memory, or other volatility solid state memory. Accordingly, the memory 440 may further include a memory controller configured to provide access of the processor 450 to the memory 440.

The processor 450 is a control center of the applications for calling devices, which utilizes various interfaces and wires to couple various parts of the mobile phone. By running or executing the software program and/or modules stored in the memory 440, and by invoking data stored in the memory 440, the various functions and data processing functions may be executed, thus integrally monitoring the mobile phone. In an embodiment, the processor 450 may include one or more processing units. In an embodiment, the processor 450 may be integrated with an application processor and a modem processor. The application processor mainly processes the operating system, a user interface and an application. The modem processor mainly processes wireless communication. It may be understood that, the above modem processor may be not integrated in the processor 450.

Further, the processor 450 is configured to call the programs stored in the memory 440 to perform followings: in response to detecting that terminal is in a charging state, acquiring a current ratio of remaining battery capacity to total battery capacity; determining a target curvature angle of the flexible display screen based at least on the current ratio; and controlling the flexible display screen to present the target curvature angle, so as to indicate a charging progress through the target curvature angle.

In an embodiment, when the processor 450 determines the target curvature angle of the flexible display screen based at least on the current ratio, the processor 450 is configured to: query the target curvature angle corresponding to the current ratio according to a pre-established correspondence between ratios and curvature angles. The ratio is in inverse proportion to the curvature angle in the pre-established correspondence.

In an embodiment, in the pre-established correspondence, the curvature angle of 0° has a corresponding ratio of 1.

In an embodiment, a plurality of electromagnets arranged side by side are provided on a backside of the flexible display screen. When the processor 450 controls the flexible display screen to present the target curvature angle, the processor 450 is configured to control the flexible display screen to present the target curvature angle by controlling polarities of electrodes and/or magnetic intensities of the plurality of electromagnets.

In an embodiment, before determining the target curvature angle of the flexible display screen based at least on the current ratio, the processor 450 is further configured to: determine whether the current ratio is greater than a predetermined ratio threshold; determine the target curvature angle of the flexible display screen when the current ratio is greater than the predetermined ratio threshold; and acquire a new ratio of the remaining battery capacity to the total battery capacity when the current ratio is not greater than the predetermined ratio threshold.

Embodiments of the present disclosure provide a computer storage medium having a computer program for electronic data exchange stored thereon. When the computer program is executed by a computer, the computer is caused to perform a part of or all of steps in any of the method provided by the embodiments with reference to FIG. 1-FIG. 2.

The terminal including the flexible display screen and the battery according to embodiments of the present disclosure acquires the current ratio of remaining battery capacity to total battery capacity in response to detecting that the terminal is in the charging state, determines the target curvature angle of the flexible display screen based at least on the current ratio and controls the flexible display screen to present the target curvature angle so as to indicate the charging progress through the target curvature angle. In this way, the user may acquire the charging progress conveniently and intuitively.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, unless specified otherwise.

It will be understood that, the flow chart or any process or method described herein in other manners may represent a module, segment, or portion of code that comprises one or more executable instructions to implement the specified logic function(s) or that comprises one or more executable instructions of the steps of the progress. Although the flow chart shows a specific order of execution, it is understood that the order of execution may differ from that which is depicted. For example, the order of execution of two or more boxes may be scrambled relative to the order shown.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs comprise one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks, CD, etc. Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

The forgoing description is only directed to preferred embodiments of the present disclosure, but not used to limit the present disclosure. All modifications, equivalents, variants and improvements made within the spirit and principle of the present disclosure shall fall within the protection scope of the present disclosure.

What is claimed is:

1. A state-of-charge indication method, comprising:
   acquiring a current ratio of a remaining battery capacity to a total battery capacity;
   determining a target curvature angle of a flexible display screen associated with a terminal based at least on the current ratio, the target curvature angle being between a line connecting two ends of the terminal and a tangent line at one end of the terminal; and
   controlling the flexible display screen to present the target curvature angle.

2. The method of claim 1, wherein determining the target curvature angle of the flexible display screen associated with the terminal based at least on the current ratio comprises:
   updating the target curvature angle and the current ratio when the terminal is in a charging state, wherein the current ratio is inversely proportional to the target curvature angle; and
   controlling the flexible display screen to present the updated target curvature angle.

3. The method of claim 2, wherein the target curvature angle of 0° has a corresponding ratio of 1.

4. The method of claim 1, wherein the flexible display screen associated with the terminal has a plurality of electromagnets arranged side by side provided on a backside of the flexible display screen.

5. The method of claim 4, wherein controlling the flexible display screen to present the target curvature angle comprises:
   controlling the flexible display screen to present the target curvature angle by performing at least one of controlling polarities of electrodes of the plurality of electromagnets and controlling magnetic intensities of the plurality of electromagnets.

6. The method of claim 1, further comprising:
   determining whether the current ratio is greater than a predetermined ratio threshold;
   determining the target curvature angle of the flexible display screen when the current ratio is greater than the predetermined ratio threshold; and
   acquiring a new ratio of the remaining battery capacity to the total battery capacity when the current ratio is not greater than the predetermined ratio threshold.

7. The method of claim 1, wherein acquiring the current ratio of the remaining battery capacity to the total battery capacity comprises:
   acquiring the remaining battery capacity; and
   calculating the current ratio according to the remaining battery capacity to the total battery capacity.

8. The method of claim 1, controlling the flexible display screen to present the target curvature angle by performing one of followings:
   controlling an angle between a tangent plane at a maximum curvature of the flexible display screen and a predetermined reference plane;
   controlling an angle between a line connecting two ends of the terminal and a line perpendicular to a surface of the charging socket;
   controlling an angle between a line connecting two ends of the terminal and a line parallel to the surface of the charging socket;
   controlling an angle between a line connecting two ends of the terminal and a predetermined reference plane; and
   controlling an angle between a line connecting two ends of the terminal and a predetermined reference line.

9. A state-of-charge indication device, the device comprising:
   a non-transitory computer-readable medium comprising computer-executable instructions stored thereon, and an instruction execution system configured by the instructions to implement at least one of: a battery capacity detecting module, configured to acquire a current ratio of a remaining battery capacity to a total battery capacity;
   an angle determining module, configured to determine a target curvature angle of a flexible display screen associated with a terminal based at least on the current ratio, the target curvature angle being between a line connecting two ends of the terminal and a tangent line at one end of the terminal; and a curvature controlling module, configured to control the flexible display screen to present the target curvature angle.

10. The device of claim 9, wherein the angle determining module is configured to update the target curvature angle and the current ratio when the terminal is in charging state, wherein the current ratio is inversely proportional to the target curvature angle.

11. The device of claim 9, wherein the flexible display screen associated with the terminal has a plurality of electromagnets arranged side by side provided on a backside of the flexible display screen.

12. The device of claim 11, wherein the curvature controlling module is configured to control the flexible display screen to present the target curvature angle by performing at least one of followings:
   controlling polarities of electrodes of the plurality of electromagnets; and
   controlling magnetic intensities of the plurality of electromagnets.

13. The device of claim 9, wherein the instruction execution system is further configured to implement:
   a battery capacity determining module, configured to determine whether the current ratio is greater than a predetermined ratio threshold;
   wherein the angle determining module is configured to determine the target curvature angle of the flexible display screen when the current ratio is greater than the predetermined ratio threshold; and the battery capacity detecting module is further configured to acquire a new ratio of the remaining battery capacity to the total battery capacity when the current ratio is not greater than the predetermined ratio threshold.

14. The device of claim 9, wherein the curvature controlling module is configured to control the flexible display screen to present the target curvature angle by performing one of followings:
   controlling an angle between a tangent plane at a maximum curvature of the flexible display screen and a predetermined reference plane;
   controlling an angle between a line connecting two ends of the terminal and a line perpendicular to a surface of the charging socket;
   controlling an angle between a line connecting two ends of the terminal and a line parallel to the surface of the charging socket;
   controlling an angle between a line connecting two ends of the terminal and a predetermined reference plane; and
   controlling an angle between a line connecting two ends of the terminal and a predetermined reference line.

15. A terminal, comprising a flexible display screen, a battery, a plurality of electromagnets, memory and a processor, wherein a set of programs is stored in the memory, the processor is configured to call the programs stored in the memory to perform followings:
   acquiring a current ratio of a remaining battery capacity to a total battery capacity;
   determining a target curvature angle of the flexible display screen based at least on the current ratio, the target curvature angle being between a line connecting two ends of the terminal and a tangent line at one end of the terminal; and controlling the flexible display screen to present the target curvature angle.

16. The terminal of claim 15, wherein when the processor determines the target curvature angle of the flexible display screen based at least on the current ratio, the processor is configured to:
   update the target curvature angle and the current ratio when the terminal is in charging state, wherein the current ratio is inversely proportional to the target curvature angle.

17. The terminal of claim 16, wherein the target curvature angle of 0° has a corresponding ratio of 1.

18. The terminal of claim 15, wherein the flexible display screen associated with the terminal has a plurality of electromagnets arranged side by side provided on a backside of the flexible display screen.

19. The terminal of claim 18, wherein the processor is configured to control the flexible display screen to present the target curvature angle by performing at least one of followings:
   controlling polarities of electrodes of the plurality of electromagnets; and
   controlling magnetic intensities of the plurality of electromagnets.

20. The terminal of claim 15, wherein the processor is further configured to:
   determine whether the current ratio is greater than a predetermined ratio threshold;
   determine the target curvature angle of the flexible display screen when the current ratio is greater than the predetermined ratio threshold; and
   acquire a new ratio of the remaining battery capacity to the total battery capacity when the current ratio is not greater than the predetermined ratio threshold.

* * * * *